US006466062B2

(12) United States Patent
Escobar-Bowser

(10) Patent No.: US 6,466,062 B2
(45) Date of Patent: Oct. 15, 2002

(54) OPERATIONAL AMPLIFIER OUTPUT STAGE

(75) Inventor: Priscilla Escobar-Bowser, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/731,432

(22) Filed: Dec. 6, 2000

(65) Prior Publication Data

US 2002/0101268 A1 Aug. 1, 2002

Related U.S. Application Data

(60) Provisional application No. 60/170,727, filed on Dec. 15, 1999.

(51) Int. Cl.[7] .................................................. H03K 3/00

(52) U.S. Cl. ........................ 327/112; 327/108; 327/387

(58) Field of Search ................................ 327/112, 379, 327/387, 108; 330/262, 267, 273

(56) References Cited

U.S. PATENT DOCUMENTS

| | | | | |
|---|---|---|---|---|
| 5,276,365 A | * | 1/1994 | Maekawa | 327/537 |
| 5,351,012 A | * | 9/1994 | Toumazou | 330/264 |
| 5,352,989 A | * | 10/1994 | Toumazou et al. | 330/265 |
| 5,877,638 A | * | 3/1999 | Lin | 327/108 |

* cited by examiner

*Primary Examiner*—My-Trang Nu Ton
*Assistant Examiner*—Hiep Nguyen
(74) *Attorney, Agent, or Firm*—W. Daniel Swayze, Jr.; W. James Brady; Frederick J. Telecky, Jr.

(57) ABSTRACT

A system for driving a signal is provided that includes a biasing circuit operable to receive an input signal and operable to produce a bias signal based on the input signal. A drive circuit includes a sensor circuit including a transistor coupled to a first power supply. The drive circuit is coupled to the biasing circuit. The drive circuit is operable to receive the bias signal and to produce an amplified signal based on the bias signal. An output circuit includes a transistor coupled to a second power supply. The output circuit is coupled to the drive circuit. The output circuit is operable to receive the amplified signal and to produce an output signal based on the amplified signal.

16 Claims, 3 Drawing Sheets

38 44 74a 56a 34a 72a 28a 24a 76a 50a 32a 64a 30a 62a 52a 66a 54a 46 40 42 44 66b 54b 62b 52b 64b 30b 32b 50b 76b 72b 24b 28b 34b 74b 56b 46

38
44

88a
86a
34a
24a
28a
72a
SOURCE BIAS
SOURCE OUTPUT
32a
SOURCE SENSOR
SOURCE REFERENCE
30a
40
42
32b
SINK SENSOR
SINK REFERENCE
30b
SINK BIAS
SINK OUTPUT
72b
24b
86b
28b
88b
34b
46

38
44
94a
74a
34a
24a
90a
28a
72a
SOURCE BIAS
SOURCE OUTPUT
46
SOURCE SENSOR
SOURCE REFERENCE
30a
32a
40
42
32b
SINK SENSOR
SINK REFERENCE
30b
44
SINK BIAS
SINK OUTPUT
72b
90b
24b
28b
34b
94b
74b

46

OPERATIONAL AMPLIFIER OUTPUT STAGE

This application claims priority under 35 USC §119(e) (1) of provisional application No. 60/170,727 filed Dec. 15, 1999.

TECHNICAL FIELD OF THE INVENTION

This invention relates generally to electronic circuits and more particularly to an improved operational amplifier output stage.

BACKGROUND OF THE INVENTION

The electronics industry is continually attempting to provide products with lower and lower power requirements. One standard method for achieving reduced power requirements is to use lower power supplies to the components. However, certain conventional components are unable to operate with these lower power supplies.

For example, in order to achieve high efficiency and high output current drive, conventional operational amplifiers are designed with a Darlington output stage. The Darlington configuration, which adds one or more additional transistors, increases the gain of the output stage by a factor of at least β, the common-emitter current gain for a particular transistor. However, the increased gain provided by a conventional Darlington drive is coupled with a reduction in the dynamic output range of the output stage. For each additional transistor in the drive, an additional base-to-emitter voltage difference is introduced from the power supply to the output. This reduction in output range with respect to the power supply increases the power supply voltage required for the drive to function properly.

Thus, conventional Darlington drives may be unable to operate at the lower power supplies which are being used to reduce overall power requirements. Some Darlington drives currently in use have attempted to solve this problem of reduced output range by utilizing a pnpn or npnp compounded approach. However, this approach results in a reduced power-supply rejection ratio, in addition to increasing the complexity and cost of the drive circuit.

SUMMARY OF THE INVENTION

In accordance with the present invention, an improved operational amplifier output stage is provided that substantially eliminates or reduces disadvantages and problems associated with previously developed output stages. In particular, the present invention provides a Darlington drive with a relatively high power-supply rejection ratio that is capable of operating with a relatively low power supply.

In one embodiment of the present invention, a system for driving a signal is provided that includes a biasing circuit operable to receive an input signal and operable to produce a bias signal based on the input signal. A drive circuit includes a sensor circuit including a transistor coupled to a first power supply. The drive circuit is coupled to the biasing circuit. The drive circuit is operable to receive the bias signal and to produce an amplified signal based on the bias signal. An output circuit includes a transistor coupled to a second power supply. The output circuit is coupled to the drive circuit. The output circuit is operable to receive the amplified signal and to produce an output signal based on the amplified signal.

Technical advantages of the present invention include providing an improved system and method for driving a signal. In particular, the drive circuit includes a sensor circuit that has a transistor coupled to one power supply, and the output circuit has a transistor coupled to a second power supply. Thus, the Darlington drive of the present invention is referred to the opposite power supply as compared to a conventional Darlington drive. This configuration provides the gain benefits of a conventional Darlington drive without the disadvantages typically associated with Darlington drives. As a result, the invention is able to provide high efficiency and high output drive current, while maintaining a low propagation delay, a high power-supply rejection ratio and a wide dynamic range of the output signal. Additionally, the sourcing and sinking capabilities provided by the present invention are symmetrical. The present invention also provides a double-Darlington drive with the same dynamic output range as a single-Darlington drive.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
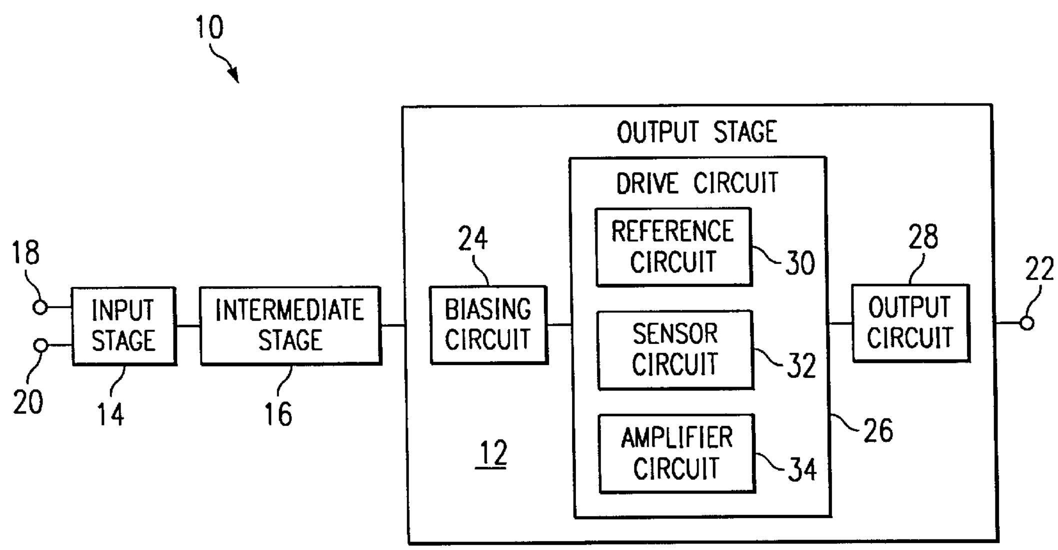
FIG. 1 is a block diagram illustrating an operational amplifier including an output stage constructed in accordance with one embodiment of the present invention.

FIG. 1 is a block diagram illustrating an operational amplifier 10 including an output stage 12 constructed in accordance with one embodiment of the present invention. The operational amplifier 10 includes an input stage 14 and an intermediate stage 16, in addition to an output stage 12. The operational amplifier 10 also includes two operational amplifier input terminals 18 and 20 and an operational amplifier output terminal 22. In operation, the operational amplifier 10 multiplies the difference between two input signals received at input terminals 18 and 20 by a gain parameter to produce an output signal at the output terminal 22. To accomplish this, the input stage 14 amplifies the difference between the signals at the input terminals 18 and 20, in addition to converting the differential-input signal to a single-ended signal. The intermediate stage 16 further amplifies the single-ended signal and provides frequency compensation. The output stage 12, which provides output drive capability, produces the output signal at the output terminal 22.

The output stage 12 comprises a biasing circuit 24, a drive circuit 26 and an output circuit 28. The drive circuit 26 comprises a reference circuit 30, a sensor circuit 32 and an amplifier circuit 34. The biasing circuit 24 receives an input signal from the intermediate stage 16 and biases the output stage 12. The drive circuit 26 receives a bias signal from the biasing circuit 24 and amplifies the bias signal. To accomplish this, the reference circuit 30 provides a reference signal to the sensor circuit 32, which provides a sensor signal to the amplifier circuit 34. The amplifier circuit 34 amplifies the sensor signal and passes an amplified signal to the output circuit 28. The output circuit 28 further amplifies the amplified signal and produces an output signal at the output terminal 22.

Figure 2:
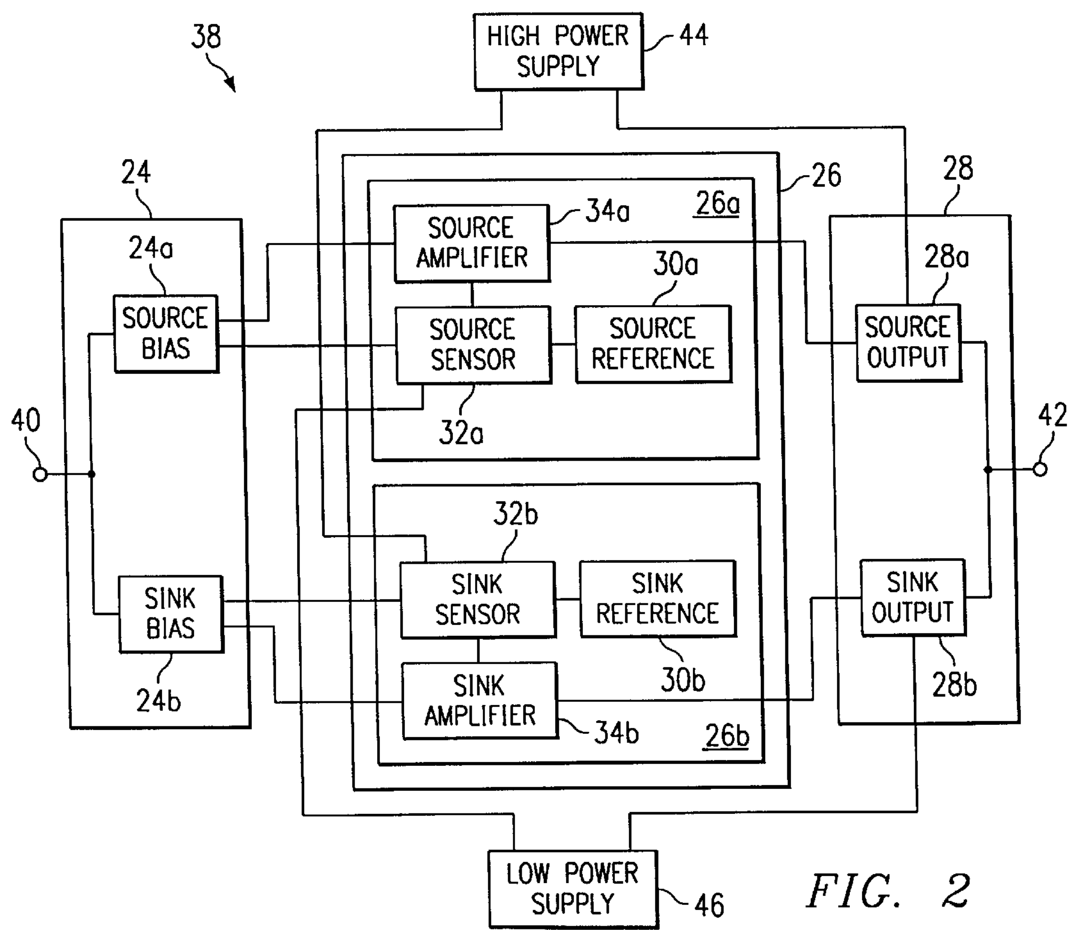
FIG. 2 is a block diagram illustrating one embodiment of the output stage of FIG. 1.

FIG. 2 is a block diagram illustrating one embodiment of a system 38, such as the output stage 12 shown in FIG. 1, for driving a signal. It will be understood that, in addition to being used as an output stage 12 for an operational amplifier 10, this driving system 38 may be used as a buffer or a voltage regulator or in any other suitable signal-driving application. In the exemplary embodiment, the driving system 38 is described as an output stage 12 for an operational amplifier 10. In addition to the biasing circuit 24, the drive circuit 26 and the output circuit 28, the driving system 38 further comprises an input terminal 40 for receiving an input signal and an output terminal 42 for producing an output signal.

As described in more detail below, the driving system 38 shown in FIGS. 2–5 comprises a plurality of source components and a plurality of sink components that function to produce an output signal at the output terminal 42. For example, current may flow into or out of the output terminal 42. When current flows out of the output terminal 42, sourcing conditions exist and the source components produce the output signal. When current flows into the output terminal 42, sinking conditions exist and the sink components produce the output signal. However, it will be understood that a driving system 38 that comprises either only source components or only sink components may be used in buffer or other suitable applications without departing from the scope of the present invention.

For the embodiment shown in FIG. 2, the biasing circuit 24 comprises a source biasing circuit 24*a* and a sink biasing circuit 24*b*. The source bias 24*a* and the sink bias 24*b* receive an input signal from the intermediate stage 16 by way of the input terminal 40. The source bias 24*a* biases the driving system 38 during sourcing conditions and the sink bias 24*b* biases the driving system 38 during sinking conditions.

The drive circuit 26 comprises a source drive circuit 26*a* and a sink drive circuit 26*b*. The source drive 26*a*, which comprises a source reference circuit 30*a*, a source sensor circuit 32*a* and a source amplifier circuit 34*a*, receives a bias signal from the source bias 24*a* during sourcing conditions, amplifies the bias signal, and provides an amplified signal to the source output 28*a*. The sink drive 26*b*, which comprises a sink reference circuit 30*b*, a sink sensor circuit 32*b* and a sink amplifier circuit 34*b*, receives a bias signal from the sink bias 24*b* during sinking conditions, amplifies the bias signal and provides an amplified signal to the sink output 28*b*.

The output circuit 28 comprises a source output circuit 28*a* and a sink output circuit 28*b*. The source output 28*a* produces an output signal at output terminal 42 during sourcing conditions, and the sink output 28*b* produces an output signal at output terminal 42 during sinking conditions.

The source output 28*a* is coupled to a high power supply 44, while the source sensor 32*a* is coupled to a low power supply 46. Similarly, the sink output 28*b* is coupled to the low power supply 46, while the sink sensor 32*b* is coupled to the high power supply 44. As described in more detail below in connection with FIG. 3, a Darlington transistor of the source sensor 32*a* is referenced to the low power supply 46, and a Darlington transistor of the sink sensor 32*b* is referenced to the high power supply 44. Thus, the Darlington drive of the present invention is referred to the opposite power supply as compared to a conventional Darlington drive.

In operation, an input signal is received at the input terminal 40 and is passed to the source bias 24*a* and the sink bias 24*b*. During sourcing conditions, the source bias 24*a* produces a bias signal that is passed to the source sensor 32*a* and the source amplifier 34*a* in the source drive 26*a*. The source reference 30*a* provides a reference signal to the source sensor 32*a*. The source sensor 32*a* produces a sensor signal based on the reference signal that is passed to the source amplifier 34*a*. The source amplifier 34*a* produces an amplified signal based on the sensor signal that is passed to the source output 28*a*. The source output 28*a* produces an output signal at the output terminal 42.

During sinking conditions, the sink bias 24*b* produces a bias signal that is passed to the sink sensor 32*b* and the sink amplifier 34*b* in the sink drive 26*b*. The sink reference 30*b* provides a reference signal to the sink sensor 32*b*. The sink sensor 32*b* produces a sensor signal based on the reference signal that is passed to the sink amplifier 34*b*. The sink amplifier 34*b* produces an amplified signal based on the sensor signal that is passed to the sink output 28*b*. The sink output 28*b* produces an output signal at the output terminal 42.

Figure 3:
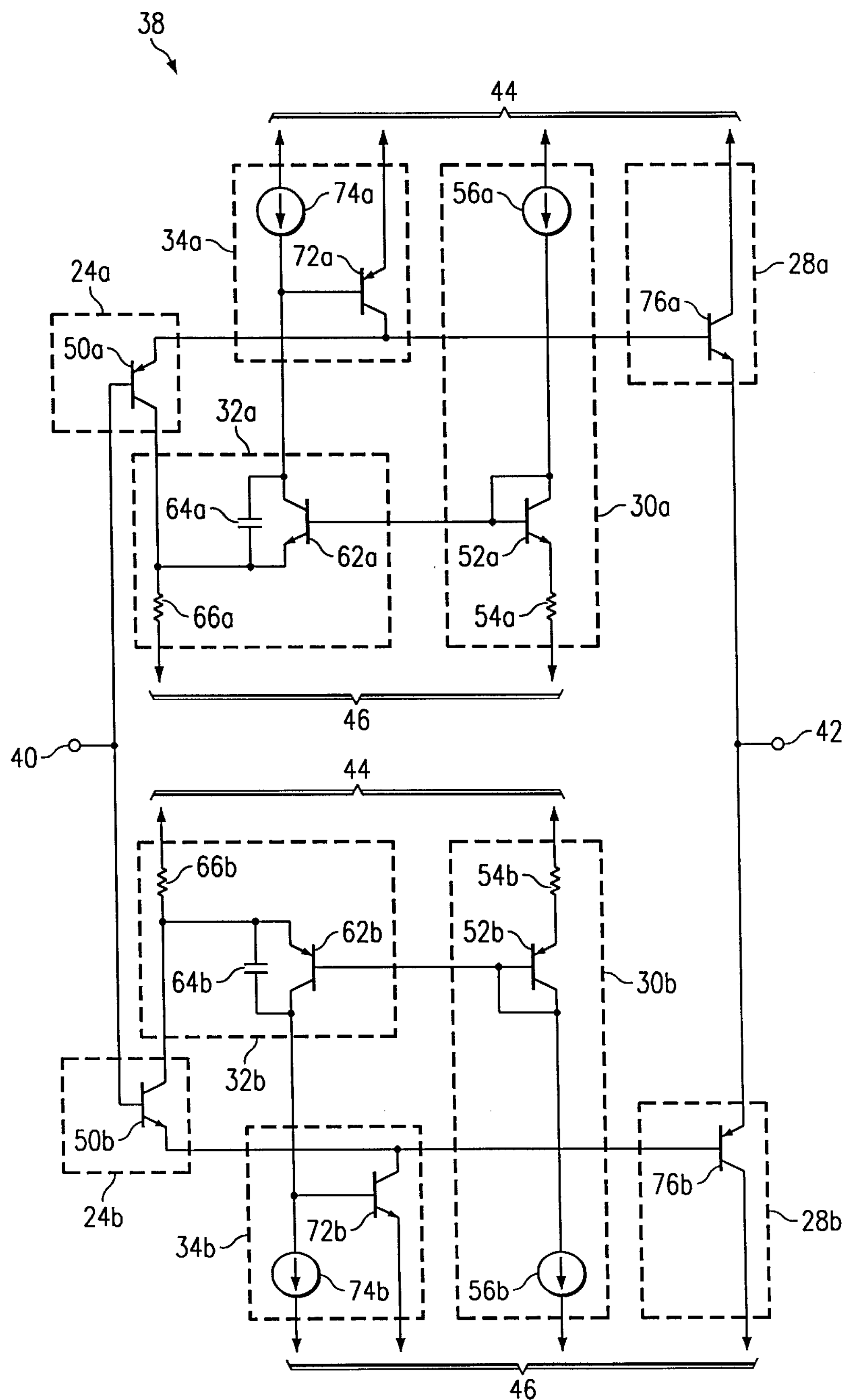
FIG. 3 is a circuit diagram illustrating one embodiment of the output stage of FIG. 2, including an amplifier circuit with a current source.

FIG. 3 is a circuit diagram illustrating one embodiment of the driving system 38 shown in FIG. 2. According to this embodiment, the source bias 24*a* comprises a pnp transistor 50*a*. The source reference 30*a* comprises an npn transistor 52*a*, a resistor 54*a* and a current source 56*a*. The source sensor 32*a* comprises an npn transistor 62*a*, a capacitor 64*a* and a resistor 66*a*. The source amplifier 34*a* comprises a pnp transistor 72*a* and a conventional current source 74*a*. The source output 28*a* comprises an npn transistor 76*a*. It will be understood that resistors 54*a* and 66*a* may be implemented with transistors without departing from the scope of the present invention. However, using resistors 54*a* and 66*a* prevents a loss in the dynamic output range and better regulates current in comparison to transistors. Furthermore, it will be understood that transistors 52*a* and 62*a* may be implemented with a MOSFET, as opposed to a bipolar junction transistor as illustrated, without departing from the scope of the present invention.

The collector of transistor 50*a* is coupled to the emitter of transistor 62*a*. The base of transistor 50*a* is coupled to the input terminal 40. The emitter of transistor 50*a* is coupled to the collector of transistor 72*a*. The collector and the base of transistor 52*a* are coupled together, and the collector of transistor 52*a* is coupled to the high power supply 44 via current source 56*a*. The bases of transistors 52*a* and 62*a* are coupled together. The emitter of transistor 52*a* is coupled to the low power supply 46 via resistor 54*a*. It will be understood that any embodiment in which the high power supply 44 supplies power that is high relative to the low power supply 46 may be used without departing from the scope of the present invention. For example, the high power supply 44 may supply a positive voltage, while the low power supply 46 supplies a negative voltage. Alternatively, the high power supply 44 may supply a positive voltage, while the low power supply 46 supplies a voltage of zero.

The collector of transistor 62*a* is coupled to the base of transistor 72*a*. The collector and emitter of transistor 62*a* are coupled together via capacitor 64*a*. The emitter of transistor 62*a* is coupled to the low power supply 46 via resistor 66*a*. The collector of transistor 72*a* is coupled to the base of transistor 76*a*. The base of transistor 72*a* is coupled to the high power supply 44 via current source 74*a*. The emitter of transistor 72*a* is coupled to the high power supply 44. The collector of transistor 76*a* is coupled to the high power supply 44. The emitter of transistor 76*a* is coupled to the output terminal 42.

The sink bias 24*b* comprises an npn transistor 50*b*. The sink reference 30*b* comprises a pnp transistor 52*b*, a resistor 54*b* and a current source 56*b*. The sink sensor 32*b* comprises a pnp transistor 62*b*, a capacitor 64*b* and a resistor 66*b*. The sink amplifier 34*b* comprises an npn transistor 72*b* and a conventional current source 74*b*. The sink output 28*b* comprises a pnp transistor 76*b*. As described above, resistors 54*b* and 66*b* may be implemented with transistors, and transistors 52*b* and 62*b* may be implemented with a MOSFET without departing from the scope of the present invention.

The collector of transistor 50*b* is coupled to the emitter of transistor 62*b*. The base of transistor 50*b* is coupled to the input terminal 40. The emitter of transistor 50*b* is coupled to the collector of transistor 72*b*. The collector and the base of transistor 52*b* are coupled together, and the collector of transistor 52*b* is coupled to the low power supply 46 via current source 56*b*. The bases of transistors 52*b* and 62*b* are coupled together. The emitter of transistor 52*b* is coupled to the high power supply 44 via resistor 54*b*. The collector of transistor 62*b* is coupled to the base of transistor 72*b*. The collector and emitter of transistor 62*b* are coupled together via capacitor 64*b*. The emitter of transistor 62*b* is coupled to the high power supply 44 via resistor 66*b*. The collector of transistor 72*b* is coupled to the base of transistor 76*b*. The base of transistor 72*b* is coupled to the low power supply 46 via current source 74*b*. The emitter of transistor 72*b* is coupled to the low power supply 46. The collector of transistor 76*b* is coupled to the low power supply 46. The emitter of transistor 76*b* is coupled to the output terminal 42.

In operation during sourcing conditions, the source reference 30*a* provides a reference signal to the source sensor 32*a*. Current source 56*a* sets the base-to-emitter voltage ($V_{BE}$) for transistor 52*a*, as well as the voltage drop across resistor 54*a*. The voltage from the base of transistor 52*a* is imposed as the reference signal onto the base of transistor 62*a* and resistor 66*a*. The source sensor 32*a* provides a sensor signal to the source amplifier 34*a* by way of the collector current of transistor 62*a*. The collector current of transistor 62*a* is amplified by the common-emitter current gain $\beta$ of transistor 72*a* and passed to the base of transistor 76*a*. Thus, the source amplifier 34*a* provides an amplified signal to the source output 28*a*. The amplified current from the collector of transistor 72*a* is also provided to the emitter of transistor 50*a*. The base current of transistor 76*a* is relatively small in the absence of a resistive load. Thus, in this situation, most of the current from transistor 72*a* becomes the collector current for transistor 50*a*.

During sinking conditions, the sink reference 30*b* provides a reference signal to the sink sensor 32*b*. Current source 56*b* sets the $V_{BE}$ for transistor 52*b*, as well as the voltage drop across resistor 54*b*. The voltage from the base of transistor 52*b* is imposed as the reference signal onto the base of transistor 62*b* and resistor 66*b*. The sink sensor 32*b* provides a sensor signal to the sink amplifier 34*b* by way of the collector current of transistor 62*b*. The collector current of transistor 62*b* is amplified by the $\beta$ of transistor 72*b* and passed to the base of transistor 76*b*. Thus, the sink amplifier 34*b* provides an amplified signal to the sink output 28*b*. The amplified current from the collector of transistor 72*b* is also provided to the emitter of transistor 50*b*. The base current of transistor 76*b* is relatively small in the absence of a resistive load. Thus, in this situation, most of the current from transistor 72*b* becomes the collector current for transistor 50*b*.

Therefore, the current through transistors 50*a* and 50*b* of the biasing circuit 24, together with the ratios of the emitter areas for transistors 76*a* and 76*b* to transistors 50*a* and 50*b*, respectively, sets the quiescent operating point of the driving system 38. This current is controlled by the reference circuit 30 by way of the voltages developed at the bases of transistors 52*a* and 52*b* with respect to the power supplies 46 and 44, respectively. The voltages at the bases of transistors 52*a* and 52*b* are set by current sources 56*a* and 56*b*, respectively. During sourcing conditions, the collector current of transistor 72*a* provides the base current to transistor 76*a*. During sinking conditions, the collector current of transistor 72*b* provides the base current to transistor 76*b*. Thus, transistors 72*a* and 72*b* of the amplifier circuit 34 act as current sources that are dynamically modulated by the biasing circuit 24 by way of the input signal which is passed from the input terminal 40 to the bases of transistors 50*a* and 50*b*.

For this embodiment, the current gain of the driving system 38, from the reference currents provided by current sources 56*a* and 56*b* to the output signal produced at the output terminal 42, is on the order of $\beta^2$. More specifically, the gain includes the $\beta$ of transistor 72*a* and the $\beta$ of transistor 76*a* for sourcing and the $\beta$ of transistor 72*b* and the $\beta$ of transistor 76*b* for sinking. Thus, the gains for sourcing and sinking both include a $\beta$ for a pnp transistor (72*a* and 76*b*) and a $\beta$ for an npn transistor (72*b* and 76*a*). This provides an advantage in that the sourcing and sinking capabilities are symmetrical because they depend on the same parameters.

In addition, the driving system 38 provides a relatively short path from the input terminal 40 to the output terminal 42 because the signal only has to travel through two base-emitter junctions, corresponding to transistors 50*a* and 76*a* or 50*b* and 76*b*. Thus, the driving system 38 is capable of operating at an increased speed relative to conventional driving systems.

Yet another advantage provided by the present invention is that the configuration of the driving system 38 allows operation with a reduced power supply differential between the high power supply 44 and the low power supply 46. This is possible because the maximum output is only reduced from the high power supply 44 by the current-to-emitter saturation voltage ($V_{CEsat}$) of transistor 72*a* and the $V_{BE}$ of transistor 76*a*, while the minimum output is only increased from the low power supply 46 by the $V_{CEat}$ of transistor 72*b* and the $V_{BE}$ of transistor 76*b*. Thus, for the embodiment shown in FIG. 3, the output range is reduced by approximately 1.2 volts from either power supply 44 and 46, resulting in a dynamic output range of 2.4 volts less than the power supply differential. Thus, the driving system 38 may operate at a power supply differential of 3.3 volts, for example, and maintain a dynamic output range of approximately 0.9 volts.

Figure 4:
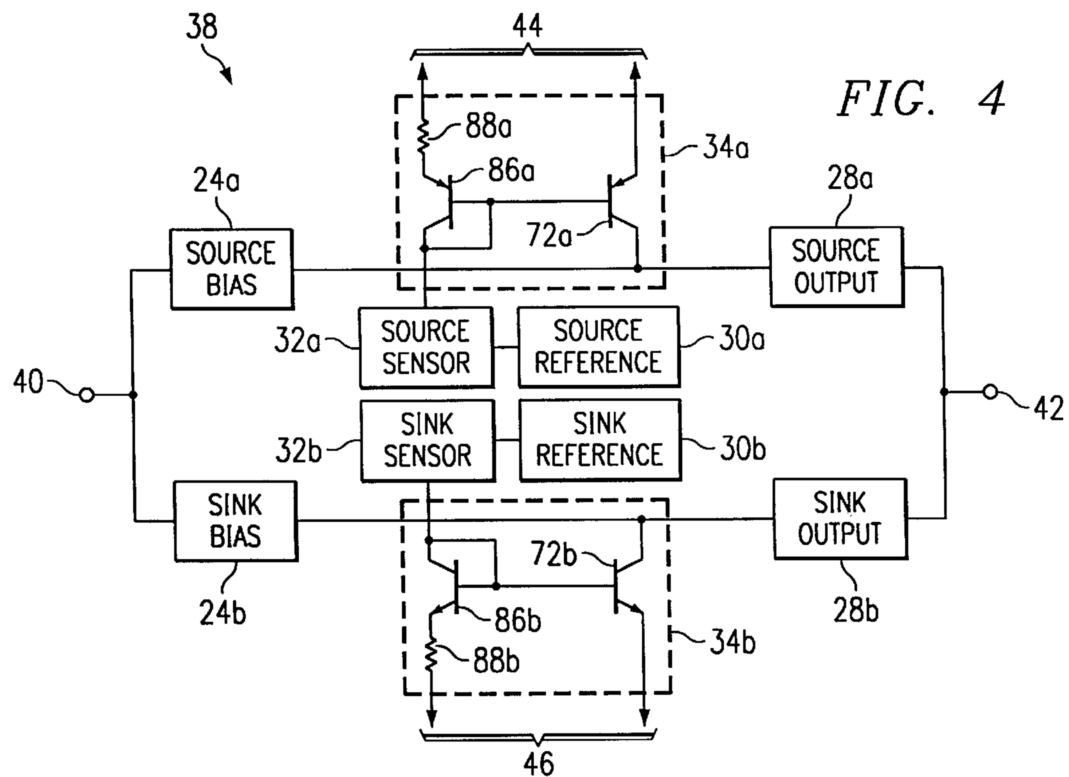
FIG. 4 is a circuit diagram illustrating one embodiment for the current source of the amplifier circuit shown in FIG. 3.

FIG. 4 is a diagram illustrating the driving system 38 of FIG. 3 with one embodiment for current sources 74*a* and 74*b*. According to this embodiment, alternatives to conventional current sources are implemented for both current sources 74*a* and 74*b*. The current source 74*a* comprises a transistor 86*a* and a resistor 88*a*. The collector and the base of transistor 86*a* are coupled together and the bases of transistors 72*a* and 86*a* are coupled together. The emitter of transistor 86*a* is coupled to the high power supply 44 via resistor 88*a*. The current source 74*b* comprises a transistor 86*b* and a resistor 88*b*. The collector and the base of transistor 86*b* are coupled together and the bases of transistors 72*b* and 86*b* are coupled together. The emitter of transistor 86*b* is coupled to the low power supply 46 via resistor 88*b*. According to one embodiment, resistors 88*a* and 88*b* are each 10 kΩ.

Figure 5:
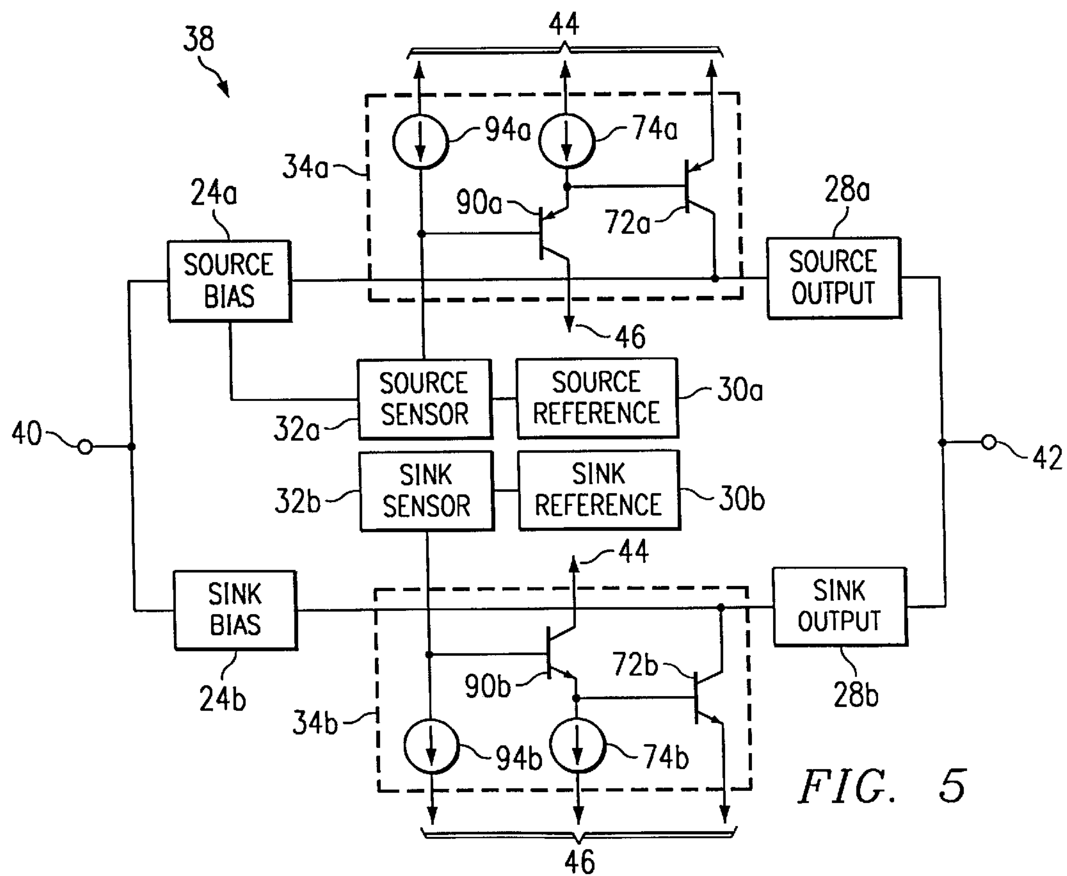
FIG. 5 is a circuit diagram illustrating an alternative embodiment for the amplifier circuit shown in FIG. 3.

FIG. 5 is a diagram illustrating an alternative embodiment for the amplifier circuits 34*a* and 34*b* that results in a double-Darlington driving system 38. In this embodiment, the source amplifier 34*a* comprises transistor 72*a* and current source 74*a*, as described above in connection with FIG. 3. The source amplifier 34*a* further comprises transistor 90*a* and current source 94*a*. The collector of transistor 90*a* is coupled to the low power supply 46. The base of transistor 90*a* is coupled to the source sensor 32*a* and to the high power supply 44 via current source 94*a*. The emitter of transistor 90*a* is coupled to the base of transistor 72*a* and to the high power supply 44 via current source 74*a*. In addition to transistor 72*b* and current source 74*b*, the sink amplifier 34*b* comprises transistor 90*b* and current source 94*b*. The collector of transistor 90*b* is coupled to the high power supply 44. The base of transistor 90*b* is coupled to the sink sensor 32*b* and to the low power supply 46 via current source 94*b*. The emitter of transistor 90*b* is coupled to the base of transistor 72*b* and to the low power supply 46 via current source 74*b*.

Thus, the embodiment shown in FIG. 5 includes a double-Darlington configuration, which results in an overall gain for the driving system 38 on the order of $\beta^3$. This includes the $\beta$ of transistor 72*a*, transistor 90*a* and transistor 76*a* for sourcing and the $\beta$ of transistor 72*b*, transistor 90*b* and transistor 76*b* for sinking. Therefore, this embodiment provides better driving capability as compared to the embodiment shown in FIG. 3. Furthermore, this double-Darlington configuration has no effect on the dynamic output range of the driving system 38, in contrast to conventional double-Darlington drives which have reduced output ranges compared to single-Darlington drives. However, the embodiment shown in FIG. 3 may be used when a reduced number of components and the corresponding layout and cost benefits are more important than a higher gain.

Although the present invention has been described with several embodiments, various changes and modifications may be suggested to one skilled in the art. It is intended that the present invention encompass such changes and modifications as fall within the scope of the appended claims.

What is claimed is:

1. A system for driving a signal, comprising:

a biasing circuit operable to receive an input signal and operable to produce a bias signal based on the input signal;

a drive circuit comprising a sensor circuit including a transistor coupled to a first power supply, the drive circuit coupled to the biasing circuit and operable to receive the bias signal and to produce an amplified signal based on the bias signal;

an output circuit comprising a transistor coupled to a second power supply, the output circuit coupled to the drive circuit and operable to receive the amplified signal and to produce an output signal based on the amplified signal; and an amplifier circuit, the amplifier circuit comprising:

a first transistor with a collector coupled to the biasing circuit and to the output circuit, a base, and an emitter coupled to the first power supply; and a second transistor with a collector coupled to the sensor circuit, a base coupled to the collector and to the base of the first transistor, and an emitter coupled to a resistor.

2. A system for driving a signal, comprising:

a biasing circuit operable to receive an input signal and operable to produce a bias signal based on the input signal;

a drive circuit comprising a sensor circuit including a transistor coupled to a first power supply, the drive circuit coupled to the biasing circuit and operable to receive the bias signal and to produce an amplified signal based on the bias signal;

an output circuit comprising a transistor coupled to a first power supply, the output circuit coupled to the drive circuit and operable to receive the amplified signal and to produce an output signal based on the amplified signal; and an amplifier circuit, the amplifier circuit comprising:

a first transistor with a collector coupled to the biasing circuit and to the output circuit, a base coupled to a first current source, and an emitter coupled to the first power supply; and a second transistor with a collector coupled to the first power supply, a base coupled to a second current source and to the sensor circuit, and an emitter coupled to the second power supply.

3. A system for driving a signal, comprising:

a biasing circuit operable to receive an input signal and operable to produce a bias signal based on the input signal;

a drive circuit comprising a sensor circuit including a transistor coupled to a first power supply, the drive circuit coupled to the biasing circuit and operable to receive the bias signal and to produce an amplified signal based on the bias signal;

an output circuit comprising a transistor coupled to a first power supply, the output circuit coupled to the drive circuit and operable to receive the amplified signal and to produce an output signal based on the amplified signal; and an input terminal, the biasing circuit comprising a transistor with a collector coupled to the sensor circuit, a base coupled to the input terminal, and an emitter coupled to the drive circuit.

4. A system for driving a signal, comprising:

a biasing circuit operable to receive an input signal and operable to produce a bias signal based on the input signal;

a drive circuit comprising a senor circuit including a transistor coupled to a first power supply, the drive circuit coupled to the biasing circuit and operable to receive the bias signal and to produce an amplified signal based on the bias signal;

an output circuit comprising a transistor coupled to a second power supply, the output circuit coupled to the drive circuit and operable to receive the amplified signal and to produce an output signal based on the amplified signal; and wherein the sensor circuit further comprises a capacitor, the transistor of the sensor circuit having a collector coupled to the capacitor and having an emitter coupled to the capacitor.

5. A system for driving a signal, comprising:

a source biasing circuit operable to receive an input signal and operable to produce a source bias signal based on the input signal;

a sink biasing circuit operable to receive the input signal and operable to produce a sink bias signal based on the input signal;

a source drive circuit comprising a source sensor circuit including a transistor coupled to a low power supply, the source drive circuit coupled to the source biasing circuit and operable to receive the source bias signal and to produce a source amplified signal based on the source bias signal;

a sink drive circuit comprising a sink sensor circuit including a transistor coupled to a high power supply, the sink drive circuit coupled to the sink biasing circuit and operable to receive the sink bias signal and to produce a sink amplified signal based on the sink bias signal;

a source output circuit comprising a transistor coupled to the high power supply, the source output circuit coupled to the source drive circuit and operable to receive the source amplified signal and to produce a source output signal based on the source amplified signal;

a sink output circuit comprising a transistor coupled to the low power supply, the sink output circuit coupled to the sink drive circuit and operable to receive the sink amplified signal and to produce a sink output signal based on the sink amplified signal; and wherein the source drive circuit further comprises a source reference circuit, the source reference circuit comprising a transistor with a collector coupled to a current source, a base coupled to the collector and to the source sensor circuit, and an emitter coupled to a resistor; and the sink drive circuit further comprises a sink reference circuit, the sink reference circuit comprising a transistor with a collector coupled to a current source, a base coupled to the collector and to the sink sensor circuit, and an emitter coupled to a resistor.

6. A system for driving a signal, comprising:

a source biasing circuit operable to receive an input signal and operable to produce a source bias signal based on the input signal;

a sink biasing circuit operable to receive the input signal and operable to produce a sink bias signal based on the input signal;

a source drive circuit comprising a source sensor circuit including a transistor coupled to a low power supply, the source drive circuit coupled to the source biasing circuit and operable to receive the source bias signal and to produce a source amplified signal based on the source bias signal;

a sink drive circuit comprising a sink sensor circuit including a transistor coupled to a high power supply, the sink drive circuit coupled to the sink biasing circuit and operable to receive the sink bias signal and to produce a sink amplified signal based on the sink bias signal;

a source output circuit comprising a transistor coupled to the high power supply, the source output circuit coupled to the source drive circuit and operable to receive the source amplified signal and to produce a source output signal based on the source amplified signal;

a sink output circuit comprising a transistor coupled to the low power supply, the sink output circuit coupled to the sink drive circuit and operable to receive the sink amplified signal and to produce a sink output signal based on the sink amplified signal; and wherein the source drive circuit further comprises a source amplifier circuit, the source amplifier circuit comprising a transistor with a collector coupled to the source biasing circuit and to the source output circuit, a base coupled to a current source and to the source sensor circuit, and an emitter coupled to the high power supply; and the sink drive circuit further comprises a sink amplifier circuit, the sink amplifier circuit comprising a transistor with a collector coupled to the sink biasing circuit and to the sink output circuit, a base coupled to a current source and to the sink sensor circuit, and emitter coupled to the low power supply.

7. A system for driving a signal, comprising:

a source biasing circuit operable to receive an input signal and operable to produce a source bias signal based on the input signal;

a sink biasing circuit operable to receive the input signal and operable to produce a sink bias signal based on the input signal;

a source drive circuit comprising a source sensor circuit including a transistor coupled to a low power supply, the source drive circuit coupled to the source biasing circuit and operable to receive the source bias signal and to produce a source amplified signal based on the source bias signal;

a sink drive circuit comprising a sink sensor circuit including a transistor coupled to a high power supply, the sink drive circuit coupled to the sink biasing circuit and operable to receive the sink bias signal and to produce a sink amplified signal based on the sink bias signal;

a source output circuit comprising a transistor coupled to the high power supply, the source output circuit coupled to the source drive circuit and operable to receive the source amplified signal and to produce a source output signal based on the source amplified signal;

a sink output circuit comprising a transistor coupled to the low power supply, the sink output circuit coupled to the sink drive circuit and operable to receive the sink amplified signal and to produce a sink output signal based on the sink amplified signal; and wherein the source drive circuit further comprises a source amplifier circuit, the source amplifier circuit comprising:

a first transistor with a collector and a base coupled to the source sensor circuit, and an emitter coupled to a resistor.

8. The system of claim 7, the sink drive circuit further comprising a sink amplifier circuit, the sink amplifier circuit comprising:

a first transistor with a collector coupled to the sink biasing circuit and to the output circuit, a base, and an emitter coupled to the low power supply, and a second transistor with a collector coupled to the sink sensor circuit, a base coupled to the collector and to the base of the first transistor, and an emitter coupled to a resistor.

9. A system for driving a signal, comprising:

a source biasing circuit operable to receive an input signal and operable to produce a source bias signal based on the input signal;

a sink biasing circuit operable to receive the input signal and operable to produce a sink bias signal based on the input signal;

a source drive circuit comprising a source sensor circuit including a transistor coupled to a low power supply, the source drive circuit coupled to the source biasing circuit and operable to receive the source bias signal and to produce a source amplified signal based on the source bias signal;

a sink drive circuit comprising a sink sensor circuit including a transistor coupled to a high power supply, the sink drive circuit coupled to the sink biasing circuit and operable to receive the sink bias signal and to produce a sink amplified signal based on the sink bias signal;

a source output circuit comprising a transistor coupled to the high power supply, the source output circuit coupled to the source drive circuit and operable to receive the source amplified signal and to produce a source output signal based on the source amplified signal;

a sink output circuit comprising a transistor coupled to the low power supply, the sink output circuit coupled to the sink drive circuit and operable to receive the sink amplified signal and to produce a sink output signal based on the sink amplified signal; and wherein the source drive circuit further comprises a source amplifier circuit, the source amplifier circuit comprising:

a first transistor with a collector coupled to the source biasing circuit and to the output circuit, a base coupled to a first current source, and an emitter coupled to the high power supply; and a first transistor with a collector coupled to the low power supply, and a base coupled to a second current source and to the source sensor circuit.

10. The system of claim 9, the sink drive circuit further comprising a sink amplifier circuit, the sink amplifier circuit comprising:

a first transistor with a collector coupled to the sink biasing circuit and to the output circuit, a base coupled to a first current source, and an emitter coupled to the low power supply; and a second transistor with a collector coupled to the high power supply, a base coupled to a second current source and to the sink sensor circuit, and an emitter coupled to the base of the first transistor.

11. A system for driving a signal, comprising:

a source biasing circuit operable to receive an input signal and operable to produce a source bias signal based on the input signal;

a sink biasing circuit operable to receive the input signal and operable to produce a sink bias signal based on the input signal;

a source drive circuit comprising a source sensor circuit including a transistor coupled to a low power supply, the source drive circuit coupled to the source biasing circuit and operable to receive the source bias signal and to produce a source amplified signal based on the source bias signal;

a sink drive circuit comprising a sink sensor circuit including a transistor coupled to a high power supply, the sink drive circuit coupled to the sink biasing circuit and operable to receive the sink bias signal and to produce a sink amplified signal based on the sink bias signal;

a source output circuit comprising a transistor coupled to the high power supply, the source output circuit coupled to the source drive circuit and operable to receive the source amplified signal and to produce a source output signal based on the source amplified signal;

a sink output circuit comprising a transistor coupled to the low power supply, the sink output circuit coupled to the sink drive circuit and operable to receive the sink amplified signal and to produce a sink output signal based on the sink amplified signal; and an input terminal, wherein the source biasing circuit comprises a transistor with a collector coupled to the source sensor circuit, a base coupled to the input terminal, and an emitter coupled to the source amplifier circuit; and the sink biasing circuit comprises a transistor with a collector coupled to the sink sensor circuit, a base coupled to the input terminal, and an emitter coupled to the sink amplifier circuit.

12. A system for driving a signal, comprising:

a source biasing circuit operable to receive an input signal and operable to produce a source bias signal based on the input signal;

a sink biasing circuit operable to receive the input signal and operable to produce a sink bias signal based on the input signal;

a source drive circuit comprising a source sensor circuit including a transistor coupled to a low power supply, the source drive circuit coupled to the source biasing circuit and operable to receive the source bias signal and to produce a source amplified signal based on the source bias signal;

a sink drive circuit comprising a sink sensor circuit including a transistor coupled to a high power supply, the sink drive circuit coupled to the sink biasing circuit and operable to receive the sink bias signal and to produce a sink amplified signal based on the sink bias signal;

a source output circuit comprising a transistor coupled to the high power supply, the source output circuit coupled to the source drive circuit and operable to receive the source amplified signal and to produce a source output signal based on the source amplified signal;

a sink output circuit comprising a transistor coupled to the low power supply, the sink output circuit coupled to the sink drive circuit and operable to receive the sink amplified signal and to produce a sink output signal based on the sink amplified signal; and an output terminal, wherein the source output circuit comprises a transistor with a collector coupled to the high power supply, a base coupled to the source amplifier circuit, and an emitter coupled to the output terminal; and the sink output circuit comprises a transistor with a collector coupled to the low power supply, a base coupled to the sink amplifier circuit, and an emitter coupled to the output terminal.

13. A system for driving a signal, comprising:

a source biasing circuit operable to receive an input signal and operable to produce a source bias signal based on the input signal;

a sink biasing circuit operable to receive the input signal and operable to produce a sink bias signal based on the input signal;

a source drive circuit comprising a source sensor circuit including a transistor coupled to a low power supply, the source drive circuit coupled to the source biasing circuit and operable to receive the source bias signal and to produce a source amplified signal based on the source bias signal;

a sink drive circuit comprising a sink sensor circuit including a transistor coupled to a high power supply, the sink drive circuit coupled to the sink biasing circuit and operable to receive the sink bias signal and to produce a sink amplified signal based on the sink bias signal;

a source output circuit comprising a transistor coupled to the high power supply, the source output circuit coupled to the source drive circuit and operable to receive the source amplified signal and to produce a source output signal based on the source amplified signal;

a sink output circuit comprising a transistor coupled to the low power supply, the sink output circuit coupled to the sink drive circuit and operable to receive the sink amplified signal and to produce a sink output signal based on the sink amplified signal; wherein the source sensor circuit further comprises a capacitor, the transistor of the source sensor circuit having a collector coupled to the capacitor and having an emitter coupled to the capacitor; and the sink sensor circuit further comprises a capacitor, the transistor of the sink sensor circuit having a collector coupled to the capacitor and having an emitter coupled to the capacitor.

14. A method for driving a signal, comprising:

providing a biasing circuit for receiving an input signal and for producing a bias signal based on the input signal;

coupling to the biasing circuit a drive circuit for receiving the bias signal and for producing an amplified signal based on the bias signal, the drive circuit comprising a sensor circuit;

coupling the sensor circuit to a first power supply through a transistor;

coupling to the drive circuit an output circuit for receiving the amplified signal and for producing an output signal based on the amplified signal;

coupling the output circuit to a second power supply through a transistor; and producing an amplified signal at the drive circuit, the drive circuit comprising a reference circuit and an amplifier circuit, producing the amplified signal comprising:

producing a reference signal at the reference circuit;

coupling to the reference circuit the sensor circuit for receiving the reference signal and the bias signal and for producing a sensor signal based on the reference signal and the bias signal; and coupling to the sensor circuit the amplifier circuit for receiving the sensor signal and the bias signal and for producing the amplified signal based on the sensor signal and the bias signal;

wherein the amplifier circuit comprises:

a first transistor with a collector coupled to the biasing circuit and to the output circuit, a base, and an emitter coupled to the second power supply; and a second transistor with a collector coupled to the sensor circuit, a base coupled to the collector and to the base of the first transistor, and an emitter coupled to a resistor.

15. A method of driving a signal, comprising:

providing a biasing circuit for receiving an input signal and for producing a bias signal based on the input signal;

coupling to the biasing circuit a drive circuit for receiving the bias signal and for producing an amplified signal based on the bias signal, the drive circuit comprising a sensor circuit;

coupling the sensor circuit to a first power supply through a transistor;

coupling to the drive circuit an output circuit for receiving the amplified signal and for producing an output signal based on the amplified signal;

coupling the output circuit to a second power supply through a transistor; and producing an amplified signal at the drive circuit, the drive circuit comprising a reference circuit and an amplifier circuit, producing the amplified signal comprising:

producing a reference signal at the reference circuit;

coupling to the reference circuit the sensor circuit for receiving the reference signal and the bias signal and for producing a sensor signal based on the reference signal and the bias signal; and coupling to the sensor circuit the amplifier circuit for receiving the sensor signal and the bias signal and for producing the amplified signal based on the sensor signal and the bias signal;

wherein the amplifier circuit comprises:

a first transistor with a collector coupled to the biasing circuit and to the output circuit, a base coupled to a first current source, and an emitter coupled to the second power supply; and a second transistor with a collector coupled to the first power supply, and a base coupled to a second current source and to the sensor circuit.

16. A method of driving a signal, comprising:

providing a biasing circuit for receiving an input signal and for producing a bias signal based on the input signal;

coupling to the biasing circuit a drive circuit for receiving the bias signal and for producing an amplified signal based on the bias signal, the drive circuit comprising a sensor circuit;

coupling the sensor circuit to a first power supply through a transistor;

coupling to the drive circuit an output circuit for receiving the amplified signal and for producing an output signal based on the amplified signal;

coupling the output circuit to a second power supply through a transistor; and coupling the sensor circuit to a first power supply through a transistor further comprising coupling a capacitor to a collector and an emitter of the transistor.

* * * * *